United States Patent
Yamamoto et al.

(10) Patent No.: US 11,810,993 B2
(45) Date of Patent: Nov. 7, 2023

(54) SOLAR CELL, MULTI-JUNCTION SOLAR CELL, SOLAR CELL MODULE, AND PHOTOVOLTAIC POWER GENERATION SYSTEM

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Kazushige Yamamoto, Yokohama Kanagawa (JP); Soichiro Shibasaki, Nerima Tokyo (JP); Mutsuki Yamazaki, Yokohama Kanagawa (JP); Naoyuki Nakagawa, Setagaya Tokyo (JP); Sara Yoshio, Yokohama Kanagawa (JP)

(73) Assignees: KABUSHIKI KAISHA TOSHIBA, Tokyo (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 49 days.

(21) Appl. No.: 16/799,987

(22) Filed: Feb. 25, 2020

(65) Prior Publication Data

US 2020/0194608 A1   Jun. 18, 2020

Related U.S. Application Data

(63) Continuation of application No. PCT/JP2018/034689, filed on Sep. 19, 2018.

(51) Int. Cl.
*H01L 31/0725* (2012.01)
*H01L 31/032* (2006.01)
(Continued)

(52) U.S. Cl.
CPC ...... *H01L 31/0725* (2013.01); *H01L 31/0323* (2013.01); *H01L 31/028* (2013.01); *H01L 31/02725* (2013.01); *H01L 33/343* (2013.01)

(58) Field of Classification Search
CPC . H01L 31/0725; H01L 31/0323; H01L 31/06; H01L 31/02725; H01L 31/028;
(Continued)

(56) References Cited

U.S. PATENT DOCUMENTS 7,468,485 B1 * 12/2008 Swanson ............. H01L 31/0682
                                                       136/243
2009/0211635 A1 *  8/2009 Niira ..................... H01L 31/068
                                                       136/258
(Continued)

FOREIGN PATENT DOCUMENTS

EP    1870944    12/2007
EP    3748697    12/2020
(Continued)

OTHER PUBLICATIONS

Colleen M. McShane "Junction studies on electrochemically fabricated p-n Cu2O homojunction solar cells for efficiency enhancement" Phys. Chem. Chem. Phys., 2012, 14, 6112-6118 (Year: 2012).*

Yun Seog Lee "Nitrogen-doped cuprous oxide as a p-type holetransporting layer in thin-film solar cells". Mater. Chem. A, 2013, 1, 15416 (Year: 2013).*

(Continued)

*Primary Examiner* — Michael Y Sun
(74) *Attorney, Agent, or Firm* — AMIN, TUROCY & WATSON, LLP

(57) ABSTRACT

A solar cell of an embodiment includes a p-electrode, a p-type light-absorbing layer directly in contact with the p-electrode, an n-type layer, and an n-electrode. The n-type layer is disposed between the p-type light-absorbing layer and the n-electrode. A region from an interface between the p-type light-absorbing layer and the p-electrode to 10 nm to (Continued)

100 nm from the interface in a direction of the n-type layer is a p+ type region including a p-type dopant.

15 Claims, 7 Drawing Sheets

(51) Int. Cl.
*H01L 31/028* (2006.01)
*H01L 31/0272* (2006.01)
*H01L 33/34* (2010.01)

(58) Field of Classification Search
CPC .............. H01L 33/343; H01L 31/0463; H01L 31/0336; Y02E 10/541; Y02E 10/547
See application file for complete search history.

(56) References Cited

U.S. PATENT DOCUMENTS

| | | | |
|---|---|---|---|
| 2013/0112265 A1* | 5/2013 | Yu ..................... | H01L 31/1804 136/258 |
| 2013/0192656 A1* | 8/2013 | Hardin ................ | H01L 31/0687 136/244 |
| 2014/0238847 A1 | 8/2014 | Lee et al. | |
| 2015/0083212 A1 | 3/2015 | Beck et al. | |
| 2018/0198017 A1* | 7/2018 | Koike .................. | H01L 31/072 |
| 2019/0198697 A1 | 6/2019 | Honishi et al. | |
| 2019/0296174 A1 | 9/2019 | Gloeckler et al. | |
| 2019/0386161 A1 | 12/2019 | Shibasaki et al. | |
| 2020/0006583 A1 | 1/2020 | Shibasaki et al. | |
| 2020/0006589 A1 | 1/2020 | Yamamoto et al. | |
| 2020/0035849 A1 | 1/2020 | Honishi et al. | |

FOREIGN PATENT DOCUMENTS

| | | |
|---|---|---|
| JP | 2014-170865 | 9/2014 |
| JP | 2015-79881 | 4/2015 |
| JP | 2016-122749 | 7/2016 |
| JP | 2017-54917 | 3/2017 |
| JP | 2017-098479 | 6/2017 |
| JP | 2019-057536 | 4/2019 |
| JP | 2019-169545 | 10/2019 |
| WO | 2006/101200 | 9/2006 |
| WO | 2018/071509 | 4/2018 |
| WO | 2019/146119 | 1/2019 |
| WO | 2019/146120 | 1/2019 |
| WO | 2019/180854 | 9/2019 |

OTHER PUBLICATIONS

Ørnulf Nordseth "Optical Analysis of a ZnO/Cu2O Subcell in a Silicon-Based Tandem Heterojunction Solar Cell" Green and Sustainable Chemistry, 2017, 7, 57-69 (Year: 2017).*

Guifang Han "Nitrogen doped cuprous oxide as low cost hole-transporting material for perovskite solar cells" Scripta Materialia 153 (2018) 104-108 (Year: 2018).*

S. Ishizuka "Control of hole carrier density of polycrystalline Cu2O thin films by Si doping" Appl. Phys. Lett. 80, 950 (2002); (Year: 2001).*

International Search Report and Written Opinion for International Application No. PCT/JP2018/034689 dated Dec. 25, 2018, 10 pgs.

Minami, et al. "Cu2O-based solar cells using oxide semiconductors", 014002, Journal of Semiconductors, vol. 37, 2016.

Minami, et al. "Efficiency enhancement using a Zn1-xGex-1 thin film as an n-type window layer in Cu2O-based heterojunction solar cells", 052301, Applied Physics Express 9, 2016.

Lee, et al. "Atomic Layer Deposited Gallium Oxide Buffer Layer Enables 1.2 V Open-Circuit Voltage in Cuprous Oxide Solar Cells", pp. 4704-4710, Advanced Materials, 2014.

Minami, et al. "High-efficiency solar cells fabricated using oxide semiconductors", Applied Physics, vol. 86, No. 8 (2017).

Nishi "A Study of High-Efficiency Heterojunction Solar Cells Using a Cu2O Sheets as p-type Oxide semiconductor Layer", Kenjiro Takayanagi Foundation, Jan. 2017.

Ishizuka, et al. "Control of hole carrier density of polycrystalline Cu2O thin films by Si doping", Applied Physics Letters, vol. 80, No. 6, pp. 950-952, 2002.

Urrejola, et al. "High Efficiency Industrial Perc Solar Cells With All PECVD-Based Rear Surface Passivation", 24EU-PVSEC 2009.

Ye, et al. "22.13% Efficient Industrial p-Type Mono PERC Solar Cell", 2016 IEEE, pp. 3360-3365.

Lee, et al. "Nitrogen-doped cuprous oxide as a p-type hole-transporting layer in thin-film solar cells", Journal of Materials Chemistry A, Vo. 1, No. 48, 2013, pp. 15416-15422.

McShane, et al. "Junction studies on electrochemically fabricated p-n Cu2O homojunction solar cells for efficiency enhancement", Physical Chemistry Chemical Physics, vol. 14, No. 17, 2012, pp. 6112-6118.

Nordseth, et al. "Optical Analysis of a ZnO/Cu20 Subcell in a Silicon-Based Tandem Heterojunction Solar Cell", Scientific Research Publishing Green and Sustainable Chemistry, 2017, 7, 56-69.

Ishizuka, et al. "Control of the growth orientation and electrical properties of polycrystalline Cu20 thin films by group-IV elements doping", Applied Physics Letters, vol. 85, No. 21, 2004.

* cited by examiner

SOLAR CELL, MULTI-JUNCTION SOLAR CELL, SOLAR CELL MODULE, AND PHOTOVOLTAIC POWER GENERATION SYSTEM

CROSS-REFERENCE TO RELATED APPLICATION

This application is a continuation application based upon and claims the benefit of priority from International Application PCT/JP2018/034689, the International Filing Date of which is Sep. 19, 2018 the entire contents of which are incorporated herein by reference.

FIELD

Embodiments described herein relate generally to a solar cell, a multi-junction solar cell, a solar cell module, and a photovoltaic power generation system.

BACKGROUND

As one of novel solar cells, there is a cuprous oxide ($Cu_2O$) solar cell. $Cu_2O$ is a wide-gap semiconductor having a bandgap of 2.1 eV. $Cu_2O$, which includes copper and oxygen existing abundantly on the earth, is a safe and inexpensive material. Therefore, $Cu_2O$ is expected to realize a solar cell with high efficiency and low cost.

Light transmissive $Cu_2O$ solar cells, in which transparent electrodes are used for both an n-electrode and a p-electrode, have been developed. In a case of light transmissive $Cu_2O$ solar cells, light can be theoretically irradiated from both the n-electrode side and the p-electrode side. However, in a case where light is irradiated from the p-electrode side, short circuit current is small compared to light irradiation from the n-electrode side. Therefore, there has been a problem of low efficiency.

DETAILED DESCRIPTION

A solar cell of an embodiment includes a p-electrode, a p-type light-absorbing layer directly in contact with the p-electrode, an n-type layer, and an n-electrode. The n-type layer is disposed between the p-type light-absorbing layer and the n-electrode. A region from an interface between the p-type light-absorbing layer and the p-electrode to 10 nm to 100 nm from the interface in a direction of the n-type layer is a p+ type region including a p-type dopant.

Hereinafter, an embodiment of the present disclosure will be described in detail with reference to drawings.

First Embodiment

Figure 1:
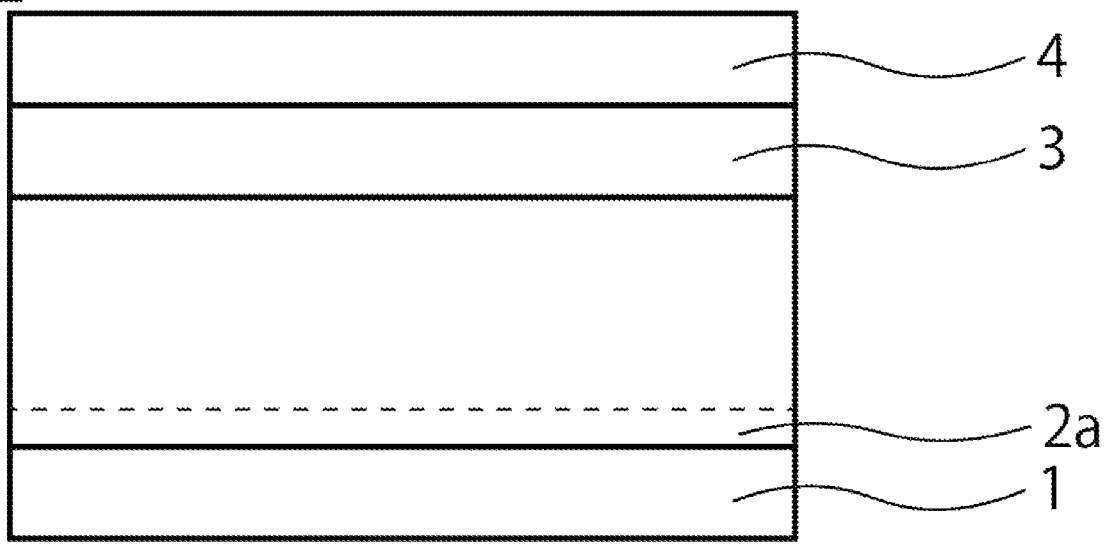
FIG. 1 is a cross-sectional view of a solar cell of an embodiment.

The first embodiment relates to a solar cell. FIG. 1 is a cross-sectional view of a solar cell 100 of the first embodiment. As illustrated in FIG. 1, the solar cell 100 according to the present embodiment includes a p-electrode 1, a p-type light-absorbing layer 2, an n-type layer 3, and an n-electrode 4. The solar cell 100 may include an intermediate layer not shown between, for example, the n-type layer 3 and the n-electrode 4. Both electrodes are preferably a transparent electrode so that sunlight can enter from any of the n-electrode 4 side and the p-electrode 1 side. A substrate not shown may be provided on the p-electrode 1 side or the n-electrode 4 side.

(p-electrode 1)

The p-electrode 1 is an electrode having light transmittance for visible light. The p-electrode 1 is an electrode in direct contact with the p-type light-absorbing layer 2. A transparent electrode made of an oxide transparent conductive film or the like is preferably used for the p-electrode 1. In a case where the substrate is provided on the p-electrode 1 side, the p-electrode 1 is a layer existing between the substrate and the p-type light-absorbing layer 2. In this case, the p-electrode 1 is in direct contact with the substrate and the p-type light-absorbing layer 2.

A monolayer film or a laminate film can be used for the p-electrode 1. A laminate-type p-electrode 1 includes, for example, a first p-electrode and a second p-electrode that are laminated. The first p-electrode is disposed on the p-type light-absorbing layer 2 side and in direct contact with the p-type light-absorbing layer 2. The first p-electrode is disposed between the second p-electrode and the p-type light-absorbing layer 2. An oxide transparent conductive film containing Sn as a main component is used for the first p-electrode. A transparent conductive film having lower resistance than the oxide transparent conductive film containing Sn as a main component is preferably used for the second p-electrode. The reason for using the laminate film is as follows. An oxide transparent conductive film containing Sn as a main component has high resistance by itself in many cases, and thus causes power generation loss due to resistance components. To prevent the power generation loss, an oxide transparent electrode having low resistance is used in combination with the oxide transparent conductive film containing Sn as a main component. In a case where the p-electrode 1 is a monolayer film, for example, the oxide transparent conductive film exemplified for the second p-electrode is preferably used.

As the first p-electrode, an oxide such as $SnO_2$ containing Sn as a main component (90 atom % or more) is preferably used. As an additive, for example, Zn, Al, Ga, In, Ti, Cu, Sb, Nb, F, or Ta is used, but the additive is not particularly limited to these substances.

Examples of the oxide transparent conductive film used as the second p-electrode include indium tin oxide (ITO), Al-doped zinc oxide (AZO), boron-doped zinc oxide (BZO), gallium-doped zinc oxide (GZO), indium-doped zinc oxide (IZO), titanium-doped indium oxide (ITiO), indium gallium zinc oxide (IGZO), and hydrogen-doped indium oxide ($In_2O_3$), but are not particularly limited to these substances. The total concentration of Sn and Sb among metals contained in the second p-electrode is preferably 10 atom % or less.

(p-type Light-Absorbing Layer 2)

The p-type light-absorbing layer 2 is a p-type semiconductor layer. The p-type light-absorbing layer 2 is disposed between the p-electrode 1 and the n-type layer 3. The p-type light-absorbing layer 2 is a semiconductor layer made of an oxide of metal containing Cu as a main component. The oxide of metal containing Cu as a main component is cuprous oxide or a complex oxide of cuprous oxide. Hereinafter, in the specification, a solar cell including, as the p-type light-absorbing layer 2, an oxide of metal containing Cu as a main component is referred to as a $Cu_2O$ solar cell. In the oxide of metal containing Cu as a main component, Cu is 60.0 atom % or more and 67.0 atom % or less, and O (oxygen) is 32.5 atom % or more and 34.0 atom % or less. The complex oxide of cuprous oxide contains metals other than Cu. In addition to Cu, the complex oxide of cuprous oxide contains one or more types of metals selected from the group consisting of Sn, Sb, Ag, Li, Na, K, Cs, Rb, Al, Ga, In, Zn, Mg, and Ca. When the complex oxide of cuprous oxide contains one or more types of metals selected from the group consisting of Ag, Li, Na, K, Cs, Rb, Al, Ga, In, Zn, Mg, and Ca in addition to Cu, the bandgap of the p-type light-absorbing layer 2 can be adjusted. The p-type light-absorbing layer 2 includes a p+ type region 2a on the p-electrode 1 side. In the p+ type region 2a, one or more types of p-type dopants of Si, Ge, and N are dispersed at a high concentration. Therefore, the p-type light-absorbing layer 2 locally contains p-type dopants. The bandgap of the p-type light-absorbing layer 2 is preferably 2.0 eV or more and 2.2 eV or less. When the bandgap of the p-type light-absorbing layer 2 is within such a range, in a multi-junction solar cell including, as a bottom cell, a solar cell in which Si is used for a light absorbing layer, and as a top cell, the solar cell of the embodiment, sunlight can be efficiently utilized in both the top cell and the bottom cell. The p-type light-absorbing layer 2 is a layer of an oxide represented by $Cu_aM_bO_c$. M is one or more types of metals selected from the group consisting of Si, Ge, N, Sn, Sb, Ag, Li, Na, K, Cs, Rb, Al, Ga, In, Zn, Mg, and Ca. a, b, and c preferably satisfy the relationships $1.80 \leq a \leq 2.01$, $0.00 \leq b \leq 0.20$, and $0.98 \leq c \leq 1.02$. The compositional ratio of the above-described p-type light-absorbing layer 2 is a compositional ratio for the entire p-type light-absorbing layer 2. In addition, the compositional ratio of compounds in the above-described p-type light-absorbing layer 2 is preferably satisfied in the entire p-type light-absorbing layer 2. Note that, when the concentration of Sn and Sb in the p-type light-absorbing layer 2 is high, defects increase and thus carrier recombination increases. Thus, the total volume concentration of Sb and Sn in the p-type light-absorbing layer 2 is preferably $1.5 \times 10^{19}$ atoms/cm$^3$ or less.

(p+ Type Region 2a)

The p-type light-absorbing layer 2 includes a p+ type region 2a on the p-electrode 1 side to suppress recombination on the p-electrode 1 side of the p-type light-absorbing layer 2. The p+ type region 2a is a region that locally includes p-type dopants at a high concentration. Examples of the p-type dopant include one or more types of elements selected from the group consisting of Si, Ge, and N. Preferred examples of the p-type dopant include one or more types of elements selected from the group consisting of Si and Ge. The p+ type region 2a is a region that exists on the p-electrode 1 side of the p-type light-absorbing layer 2. The p+ type region 2a is a region from the interface between the p-type light-absorbing layer 2 and the p-electrode 1 (start point) to 10 nm to 100 nm from the interface in the direction of the n-type layer 3 (end point), that is, a region from the interface between the p-type light-absorbing layer 2 and the p-electrode 1 (start point) to minimum 10 nm to maximum 100 nm from the interface in the direction of the n-type layer 3 (end point). The p+ type region 2a is preferably a region from the interface between the p-type light-absorbing layer 2 and the p-electrode 1 (start point) to 30 nm to 70 nm from the interface in the direction of the n-type layer 3 (end point), that is, a region from the interface between the p-type light-absorbing layer 2 and the p-electrode 1 (start point) to minimum 30 nm to maximum 70 nm from the interface in the direction of the n-type layer 3 (end point). The p+ type region 2a is a region included in the p-type light-absorbing layer 2.

When the thickness of the p+ type region 2a is too small, the effect of suppressing recombination described below decreases. In addition, when the thickness of the p+ type region 2a is too large, the effect of decreasing short circuit current appears. This is because the quantum efficiency of photocarrier generation in the p+ type region 2a is lower compared to the quantum efficiency of photocarrier layer other than the p+ type region 2a. Such decrease in the short circuit current is not preferable. The maximum concentration of the p-type dopant in the p+ type region 2a is preferably $5.0 \times 10^{19}$ atoms/cm$^3$ or more and $1.0 \times 10^{21}$ atoms/cm$^3$ or less from the viewpoint of suppressing recombination. The minimum concentration of the p-type dopant in the p+ type region 2a is preferably $1.0 \times 10^{18}$ atoms/cm$^3$ or more and $5.0 \times 10^{18}$ atoms/cm$^3$ or less. The average concentration of the p-type dopant in the p+ type region 2a is preferably $1.0 \times 10^{19}$ atoms/cm$^3$ or more and $1.0 \times 10^{20}$ atoms/cm$^3$ or less. The concentration of the p-type dopant in a part other than the p+ type region 2a of the p-type light-absorbing layer 2 is $1.0 \times 10^{18}$ atoms/cm$^3$ or less. Note that, in the embodiment, the detection limit of the p-type dopant is $1.0 \times 10^{18}$ atoms/cm$^3$. The concentration of the p-type dopant being $1.0 \times 10^{18}$ atoms/cm$^3$ or less includes both a case where no p-type dopant is contained and a case where the p-type dopant is contained at a concentration equal to or less than the detection limit. A position at which the concentration of the p-type dopant is maximum exists on the side of the interface between the p-type light-absorbing layer 2 and the p-electrode 1 in the p+ type region 2a, that is, on the side of the start point in the p+ type region 2a. A position at which the concentration of the p-type dopant is minimum exists on the n-type layer 3 side in the p+ type region 2a, that is, on the side of the end point in the p+ type region 2a.

The average concentration of the p-type dopant in the p+ type region 2a is preferably 5 times or more and 100 times or less the minimum concentration of the p-type dopant in the p+ type region 2a, and more preferably 10 times or more and 100 times or less the minimum concentration of the p-type dopant in the p+ type region 2a. In the embodiment, a large difference between the minimum concentration and the average concentration of the p-type dopant indicates that the concentration of the p-type dopant significantly decreases on the side of end point of the p+ type region 2a compared to the concentration of the p-type dopant on the side of start point of the p+ type region 2a.

The maximum concentration of the p-type dopant in the p+ type region 2a is preferably 5 times or more and 100 times or less the average concentration of the p-type dopant in the p+ type region 2a, and more preferably 10 times or more and 100 times or less the average concentration of the p-type dopant in the p+ type region 2a. In the embodiment, a large difference between the maximum concentration and the average concentration of the p-type dopant indicates that the concentration of the p-type dopant is very high on the side of start point of the p+ type region 2a compared to the concentration of the p-type dopant on the side of end point of the p+ type region 2a.

The maximum concentration of the p-type dopant in the p+ type region 2a is preferably 25 times or more and 1000 times or less the minimum concentration of the p-type dopant in the p+ type region 2a, and more preferably 100 times or more and 1000 times or less the minimum concentration of the p-type dopant in the p+ type region 2a. In the embodiment, a large difference between the maximum concentration and the average concentration of the p-type dopant indicates that the concentration of the p-type dopant is very high on the side of start point of the p+ type region 2a compared to the concentration of the p-type dopant on the side of end point of the p+ type region 2a.

A large variation in concentration in the narrow p+ type region 2a suppresses recombination and prevents decrease in short circuit current, thus enhancing power generation efficiency of the solar cell in the embodiment. Even in a case where the p-type dopant is dispersed in the entire p-type light-absorbing layer 2 at a low concentration, or at a high concentration, suppression of recombination and prevention of decrease in short circuit current cannot be achieved. Local provision of the p+ type region 2a in a cuprous oxide-type light absorbing layer has not been achieved so far. Such an effect is obtained in a case where the condition of the p+ type region 2a of the present disclosure is satisfied.

Here, a mechanism of improving characteristics by highly doping a p-electrode 1/$Cu_2O$ (p-type light-absorbing layer 2) interface with the p-type dopant in a $Cu_2O$ solar cell, the mechanism being the core of the present disclosure will be described.

Firstly, a cause of decrease in short circuit current will be described. In conventional $Cu_2O$ solar cells including an Au electrode, it has not been identified whether current decrease phenomenon occurred or not. This is because light could be irradiated from only the n-electrode 4 side. On the contrary, the light transmissive $Cu_2O$ solar cell developed by the present inventors allows light irradiation from both the p-electrode 1 side and the n-electrode 4 side. Light irradiation from both electrodes reveals that there is a large difference in current value according to the incident direction. Therefore, such a current decrease phenomenon is first recognized as an issue.

(Decrease in Short Circuit Current in a Case of Light Irradiation from the n-electrode Side)

Figure 2A:
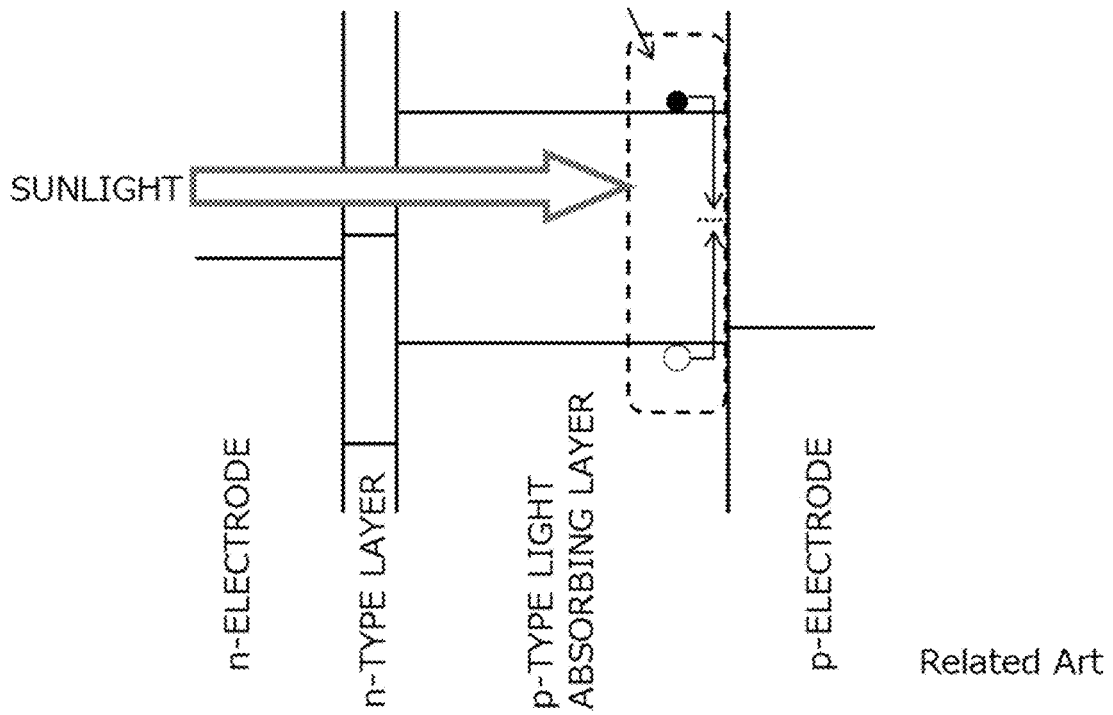
FIG. 2A is a schematic band diagram of a $Cu_2O$ solar cell.
Figure 2B:
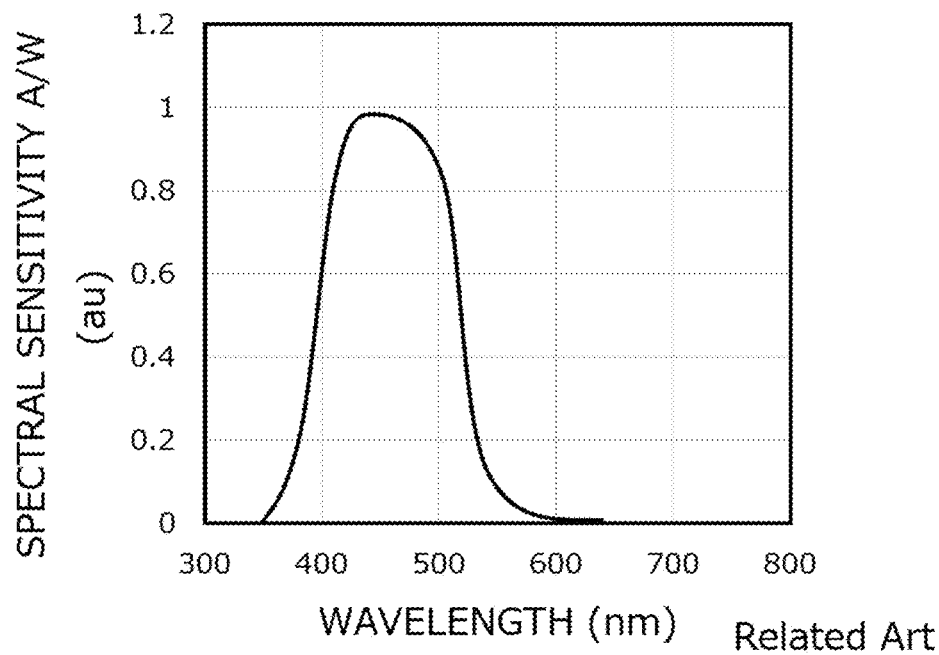
FIG. 2B is a graph showing spectral sensitivity A/W (photocurrent/light intensity) relative to respective wavelengths.

FIG. 2A is a schematic band diagram of a $Cu_2O$ solar cell in a case where light is irradiated from the n-electrode side. FIG. 2B is a graph showing spectral sensitivity A/W (photocurrent/light intensity) relative to respective wavelengths. Here, the p-electrode 1 may be either an Au electrode or a transparent electrode. The n-electrode 4 is a transparent electrode.

FIG. 2A shows the state of carrier recombination on the surface of the p-electrode 1. FIG. 2A shows that as a position is closer to the p-electrode 1, electrons (black circle) and holes (white circle) diffuse to the p-electrode 1 to cause recombination.

FIG. 2B shows a schematic spectral sensitivity of the cell of FIG. 2A. As can be seen from FIG. 2B, the spectral sensitivity at a wavelength of 500 to 600 nm is low in the vicinity of $Cu_2O$ absorbing end. The reason for this is as follows. The light absorption coefficient of $Cu_2O$ for light having a wavelength of 500 to 600 nm is small. Therefore, light having a longer wavelength tends to achieve inside $Cu_2O$. Electrons and holes generated inside $Cu_2O$ diffuse and recombine on the p-electrode 1 side, decreasing photocurrent.

The above description is a reason that, in a case where light is irradiated form the n-electrode 4 side, carriers generated in the vicinity of the p-electrode 1 tend to recombine on the surface of the p-electrode 1, and thus short circuit current decreases by the amount corresponding to light having a wavelength of 500 to 600 nm, thus decreasing efficiency. This is a recombination phenomenon occurring even when the p-electrode 1 is either an Au electrode or a transparent electrode.

(Decrease in Short Circuit Current Decrease in a Case of Light Irradiation from the p-electrode Side)

Figure 3A:
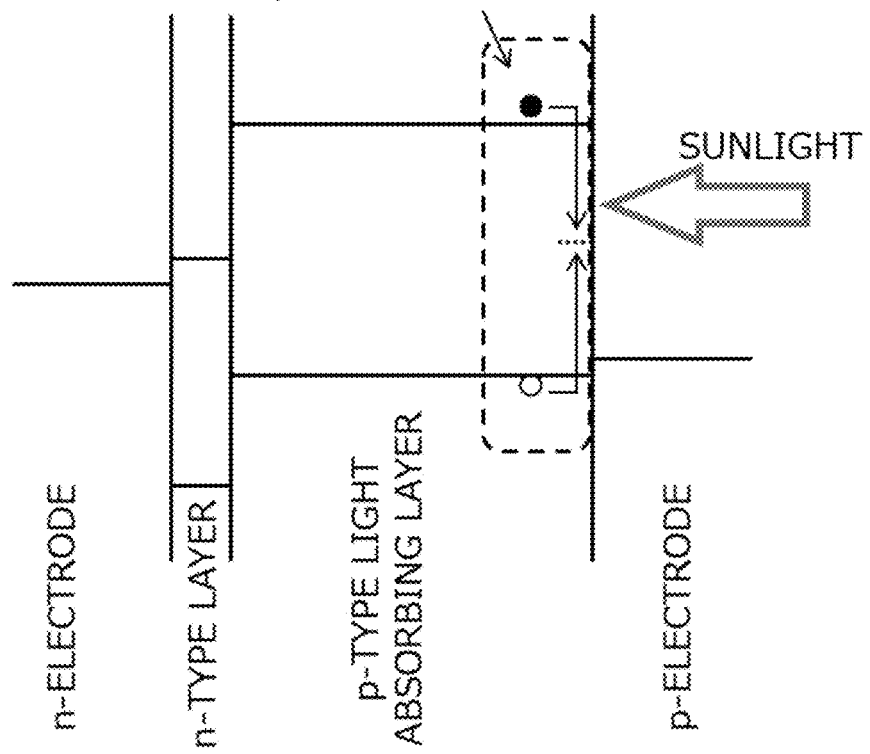
FIG. 3A is a schematic band diagram of a $Cu_2O$ solar cell.
Figure 3B:
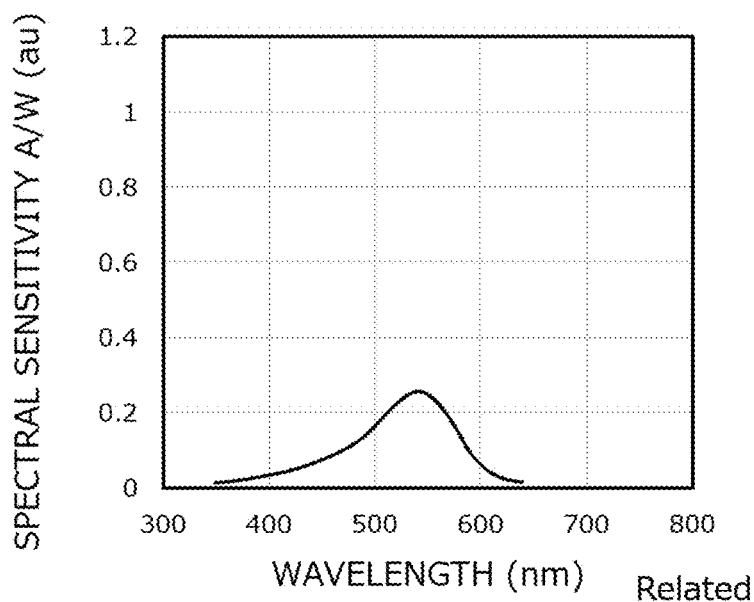
FIG. 3B is a graph showing spectral sensitivity relative to respective wavelengths.

Next, FIG. 3A is a schematic band diagram of a $Cu_2O$ solar cell in a case where light is irradiated from the p-electrode 1 side. FIG. 3B is a graph showing a spectral sensitivity A/W (photocurrent/light intensity) relative to respective wavelengths. Here, the p-electrode 1 and the n-electrode 4 are both a transparent electrode.

FIG. 3A shows the state of carrier recombination on the surface of the p-electrode 1. FIG. 3A shows that as a position is closer to the p-electrode 1, electrons and holes diffuse to the p-electrode 1 to cause recombination.

FIG. 3B shows a schematic spectral sensitivity of the cell of FIG. 3A. Unlike FIG. 2B described above, the spectral sensitivity at a wavelength of 500 nm or less is low. The reason is as follows. The light absorption coefficient of $Cu_2O$ for light having a wavelength of 500 nm or less is large. Therefore, almost all light having such a wavelength is absorbed in the vicinity of the p-electrode 1 and immediately causes recombination. Light having such a wavelength difficult to be extracted as photocurrent accordingly. Meanwhile, light having a wavelength of 500 to 600 nm, which has a small absorption coefficient, achieves inside $Cu_2O$. Generated electrons and holes diffuse on the pn-interface side. Therefore, light having such a wavelength becomes photocurrent although the amount of current is small.

The above description is a reason that in a case where light is irradiated from the p-electrode 1 side, almost all carriers recombine due to recombination on the surface of the p-electrode 1 to cause decrease in a large amount of short circuit current, thus causing significant decrease in efficiency.

(Mechanism of Increasing Short Circuit Current by High Doping of the p-type Dopant)

Figure 4A:
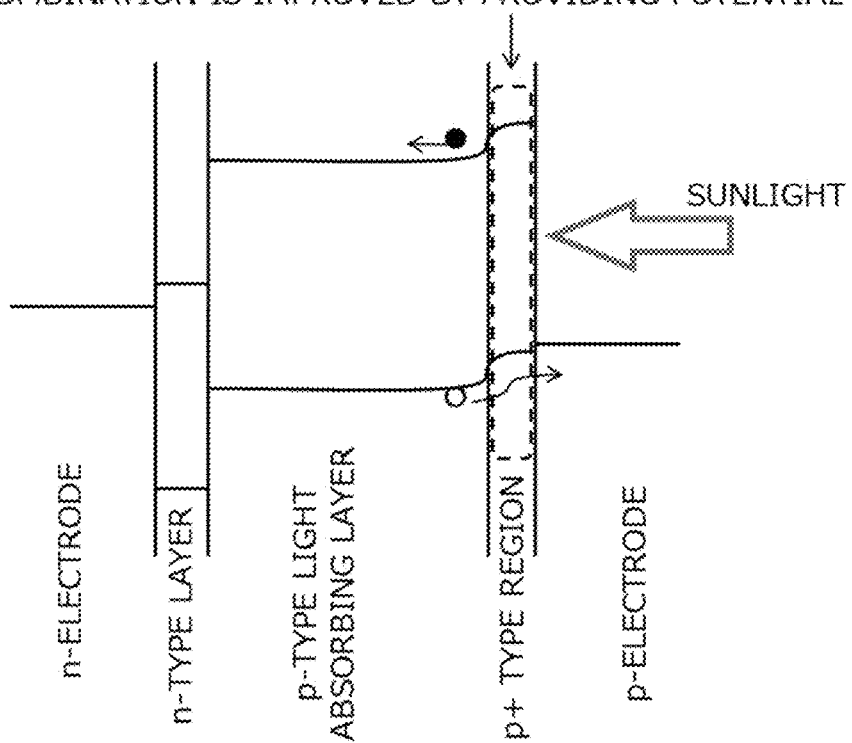
FIG. 4A is a schematic band diagram of a $Cu_2O$ solar cell in a case where a p-type dopant is highly doped in the vicinity of the surface of the p-electrode 1.
Figure 4B:
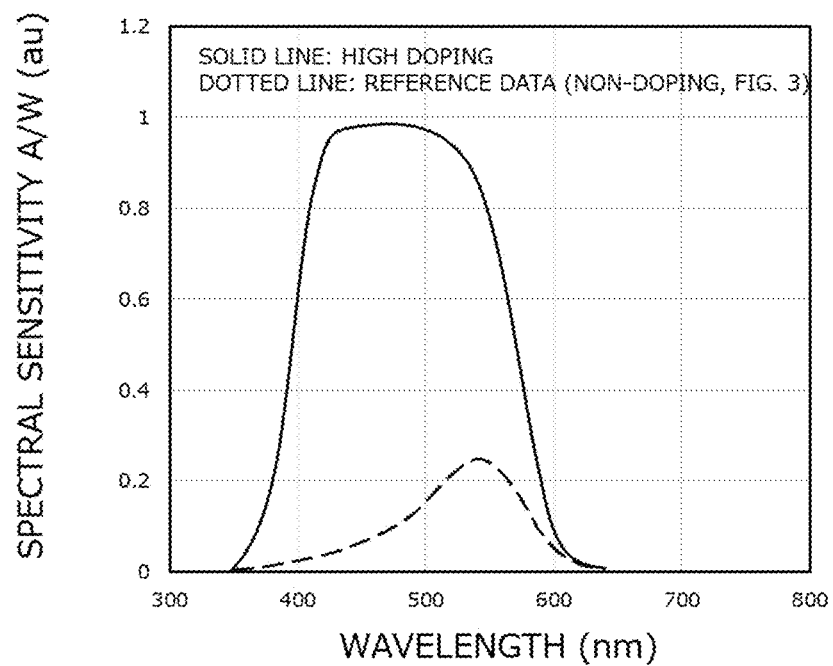
FIG. 4B is a graph showing spectral sensitivity relative to respective wavelengths.

In the $Cu_2O$ solar cell, decrease in short circuit current occurs due to recombination on the surface of the p-electrode 1 in both cases of light irradiation from the n-electrode 4 side and light irradiation from the p-electrode 1 side as described above, although the degree of the decrease differs between both cases. Highly doping the p-type dopant in the vicinity of the surface of the p-electrode 1 made of $Cu_2O$ can suppress recombination and thus increases short circuit current, that is, improve efficiency. FIG. 4A is a schematic band diagram of a $Cu_2O$ solar cell in a case where the p-type dopant is highly doped in the vicinity of the surface of the p-electrode 1. FIG. 4B is a graph showing spectral sensitivity A/W (photocurrent/light intensity) relative to respective wavelengths.

FIG. 4A is a schematic band diagram of a $Cu_2O$ solar cell in a case where the p-type dopant is highly doped in the vicinity of the surface of the p-electrode 1. Here, a case where sunlight enters from the p-electrode 1 side is shown. As can be seen from FIG. 4A, a potential barrier due to high doping is formed in front of the p-electrode 1. Electrons cannot approach the p-electrode 1 and diffuse on the pn-interface side. In other words, this is the following mechanism. Electrons and holes are spatially separated on the surface of the p-electrode 1. This suppresses recombination to increase short circuit current, thus improving efficiency.

FIG. 4B shows a schematic spectral sensitivity of the cell of FIG. 4A. FIG. 4B also shows, as reference data, the spectral sensitivity of a reference cell to which the p-type dopant is not added (data of FIG. 3B). FIG. 4B shows that the spectral sensitivity increases in the entire wavelength range, and particularly, high spectral sensitivity is observed at a wavelength of 500 nm or less, the wavelength of which photocurrent hardly flowed in the reference cell.

Although light is irradiated from the p-electrode 1 side in the above description, short circuit current and efficiency also increase by a similar mechanism in a case where light is irradiated from the n-electrode 4 side.

In conventional $Cu_2O$ solar cells, recombination occurs on the surface of the p-electrode 1 to cause current decrease. However, highly doping the p-type dopant in the vicinity of the surface of the p-electrode 1 made of $Cu_2O$ allows suppression of recombination, and realization of improvement in short circuit current and efficiency.

The position and the p-type dopant concentration of the p+ type region 2a can be determined by the secondary ion mass spectrometry (SIMS). The analytical condition is as follows: $Cs^+$ is used for primary ion species; primary acceleration voltage is 5.0 kV; and detection range is 28 μm×28 μm. The depth at which the inflection point appears in both the p-type dopant concentration distribution and the Cu concentration distribution on the p-electrode 1 side is defined as the interface between the p-electrode 1 and the p-type light-absorbing layer 2. The depth determined from the fitting curve of the p-type dopant concentration (dopant concentration=Cs×erfc (x/2/L), erfc: complementary error function, Cs: dopant concentration at the interface between the p-electrode 1 and the p-type light-absorbing layer 2, x: depth, the interface between the p-electrode 1 and the p-type light-absorbing layer 2 is x=0, L: diffusion length of the dopant), the depth in a direction from the interface to the n-type layer 3 is defined as the diffusion length of the p-type dopant. The region having a p-type dopant concentration of $1.0×10^{18}$ $atoms/cm^3$ or more is defined as the p+ type region 2a. Note that, in a case where two or more types of p-type dopants are contained, the total concentration of the p-type dopants is defined as the p-type dopant concentration. In a case where the p-type dopant concentration at the inflection point in the Cu concentration distribution on the p-electrode 1 side (i.e. the interface between the p-electrode 1 and the p-type light-absorbing layer 2) is $1.0×10^{18}$ $atoms/cm^3$ or less, the p+ type region 2a is determined not to exist in the p-type light-absorbing layer 2. A case where the p-type dopant concentration is $1.0×10^{18}$ $atoms/cm^3$ or more at a position deeper than 100 nm from the interface between the p-electrode 1 and the p-type light-absorbing layer 2 to the n-type layer 3 side is considered to be a case where the p+ type region 2a is not included in the p-type light-absorbing layer 2.

Note that, in the SIMS analysis, the cross section including the center of the solar cell 100 is divided into five regions in a direction from the p-electrode 1 to the n-electrode 4. Then, analysis is performed on a virtual line from the p-electrode 1 to the p-type light-absorbing layer 2. The virtual line is formed by connecting the center of the p-electrode 1 and the center of the n-electrode 4 in each of the five divided regions. The p-type dopant concentration and the like can be determined by averaging the obtained results of five regions.

A thin film of, for example, one or more types of compounds selected from the group consisting of $SiO_x$, $GeO_x$, $SiGe_xO_y$, $SiN_x$, $SiO_xN_y$, and $GeO_xN_y$ (0<x≤2, 0<y≤2) containing the p-type dopant is deposited with a film thickness of 2 nm or less on the p-electrode 1. Then, the p-type light-absorbing layer 2 is formed. Therefore, the p-type dopant can be highly doped in the vicinity of the surface of the p-electrode 1. Note that the thin film of the compound containing the p-type dopant is absorbed in the p-type light-absorbing layer 2 in the film forming process of the p-type light-absorbing layer 2 or the like, and does not remain.

Figure 5:
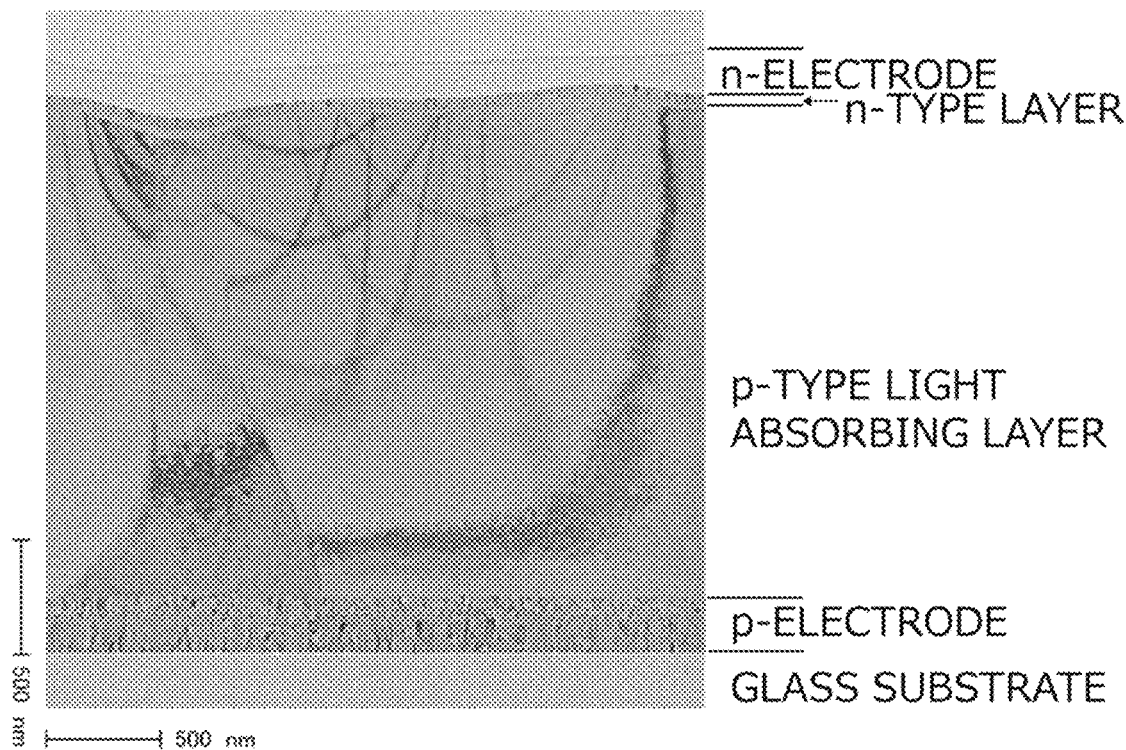
FIG. 5 is a cross-sectional image of a solar cell of an embodiment.

From the image obtained by observing the cross section of the solar cell 100 by a transmission electron microscope (TEM) under the condition at a magnification of 40,000× at an acceleration voltage of 200 kV, it can be identified that the thin film of the compound containing the p-type dopant does not remain. FIG. 5 is a cross-sectional TEM image of the solar cell 100 of the embodiment. FIG. 5 shows that, in the solar cell 100 of the embodiment, the entire surface of the p-electrode 1, which faces the p-type light-absorbing layer 2, and the entire surface of the p-type light-absorbing layer 2, which faces the p-electrode 1 form the interface.

(Passivation Layer 2b)

Figure 6:
FIG. 6 is a cross-sectional view of a solar cell of an embodiment.

Note that, more preferably, a passivation layer 2b is disposed in the solar cells 100 and 101 of the embodiment to further suppress the recombination described above, as shown in the cross-sectional view of the solar cell 101 of FIG. 6. The passivation layer 2b is an insulating layer including gaps. The passivation layer 2b of the embodiment is an insulating layer existing between the p-electrode 1 and the p-type light-absorbing layer 2 in the lamination direction of the layers constituting the solar cell 100. The passivation layer 2b has a discontinuous shape. The p-electrode 1 and the p-type light-absorbing layer 2 partially contact to each other. That is, the upper surface and the side surface of the passivation layer 2b is in direct contact with the p-type light-absorbing layer 2, and the lower surface of the passivation layer 2b is in direct contact with the p-electrode 1. At least a part of the side surface of the passivation layer 2b is preferably in direct contact with the p+ type region 2a of the p-type light-absorbing layer 2.

The film thickness of the passivation layer 2b is preferably 5 nm or more and 200 nm or less from the viewpoint of suppressing recombination. The film thickness of the passivation layer 2b in the embodiment includes a case of a film thickness smaller than the thickness of the p+ type region 2a and a case of a film thickness larger than the thickness of the p+ type region 2a. From the viewpoint of suppressing recombination, in the direction from the p-electrode 1 to the n-electrode 4, the area in which the passivation layer 2b and the p-type light-absorbing layer 2 are in contact is preferably 80% or more and 95% or less of the sum of the area in which the passivation layer 2b and the p-type light-absorbing layer 2 are in contact and the area in which the p-type light-absorbing layer 2 and the p-electrode 1 are in contact. According to the study of the present inventors, the passivation layer 2b need to be an insulating layer. Examples of a material for the passivation layer 2b include, but are not particularly limited, an Hf oxide, and a Ta oxide. An Si oxynitride and a Ge oxynitride are not suitable for the material. The passivation layer 2b is, for example, a mesh-like, dotted, or line-shaped insulating layer, which is not a solid film and includes gaps. Note that the p-electrode 1 and the p-type light-absorbing layer 2 do not face each other in a part in which the passivation layer 2b is disposed, whereas the p-electrode 1 and the p-type light-absorbing layer 2 face each other in the gaps of the passivation layer 2b.

The thickness of the p-type light-absorbing layer 2 is determined by cross-section observation by an electron microscope or a profilometer. The thickness is preferably 1,000 nm or more and 10,000 nm or less.

The p-type light-absorbing layer 2 is preferably formed by, for example, sputtering.

(n-type Layer 3)

The n-type layer 3 is an n-type semiconductor layer. The n-type layer 3 is disposed between the p-type light-absorbing layer 2 and the n-electrode 4. The n-type layer 3 is in direct contact with a surface of the p-type light-absorbing layer 2 which is opposite to a surface of the p-type light-absorbing layer 2 which is in contact with the p-electrode 1. As the n-type layer 3, a layer containing an oxide layer and a sulfide layer is preferred. More specifically, the oxide layer used for the n-type layer 3 is preferably a layer selected from the group consisting of $Zn_{(1-x)}A_xO_y$ (A=Si, Ge, Sn), $Cu_{(2-x)}M_xO$ (M=Mn, Mg, Ca, Zn, Sr, Ba), and $Al_{(2-x)}Ga_xO_3$. The sulfide layer used for the n-type layer 3 is preferably a layer including one or more types of sulfides selected from the group consisting of $Zn_xIn_{(2-2x)}S_{(3-2x)}$, ZnS, and $In_xGa_{(1-x)}S$. In a case where $Zn_{(1-x)}A_xO_y$ is used for the n-type layer 3, the compositional ratio of Zn/A is desirably in a range of 1 to 3, and more preferably 1.5 to 2.5.

The thickness of the n-type layer 3 is preferably 5 nm or more and 100 nm or less. When the thickness of the n-type layer 3 is 5 nm or less, leakage current occurs in a case where the coverage of the n-type layer 3 is poor, which is not preferable. When the thickness of the n-type layer 3 is more than 100 nm, transmittance decreases. This decrease short circuit current, which is not preferable. The thickness of the n-type layer 3 is more preferably 10 nm or more and 50 nm or less accordingly. Further, the surface roughness of the n-type layer 3 is preferably 5 nm or less to achieve a film having a good coverage.

The n-type layer 3 is preferably formed by, for example, sputtering.

(n-electrode 4)

The n-electrode 4 has light transmittance for visible light and is disposed on the n-type layer 3 side. The n-type layer 3 is interposed between the n-electrode 4 and the p-type light-absorbing layer 2. An intermediate layer not shown may be provided between the n-type layer 3 and the n-electrode 4. An oxide transparent conductive film is preferably used for the n-electrode 4. Preferred examples of the oxide transparent conductive film used for the n-electrode 4 include one or more types of transparent conductive films selected from the group consisting of indium tin oxide (ITO), Al-doped zinc oxide (AZO), boron-doped zinc oxide (BZO), gallium-doped zinc oxide (GZO), indium-doped zinc oxide (IZO), titanium-doped indium oxide (ITiO), indium gallium zinc oxide (IGZO), and hydrogen-doped indium oxide ($In_2O_3$).

The thickness of the n-electrode 4 is determined by cross-section observation by an electron microscope or a profilometer. The thickness is, but not particularly limited, typically 1 nm or more and 2 μm or less.

The n-electrode 4 is preferably formed by, for example, sputtering.

Second Embodiment

Figure 7:
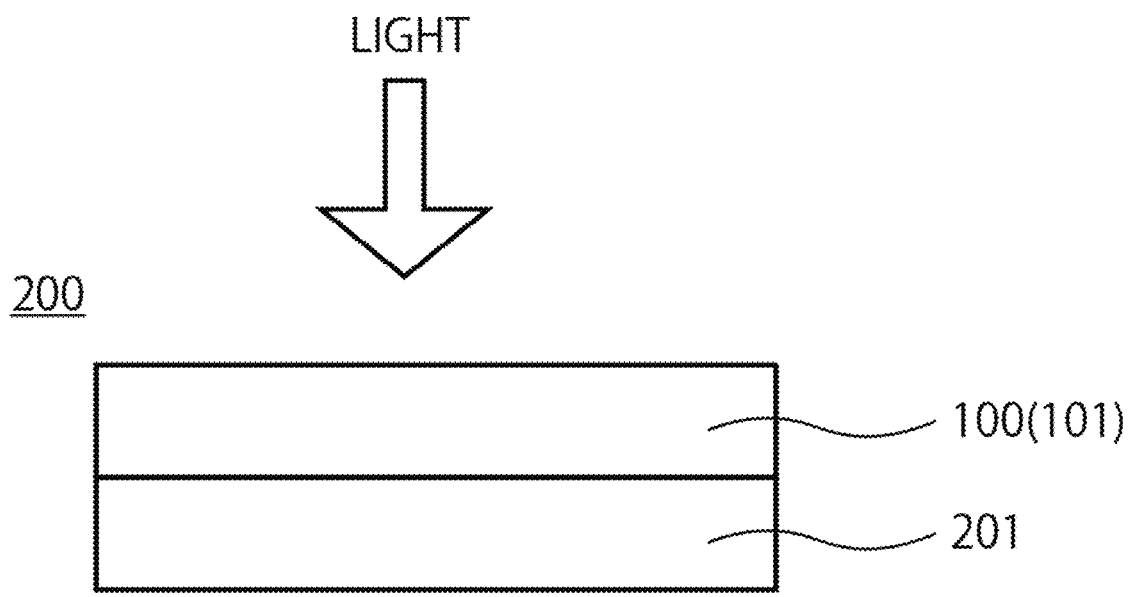
FIG. 7 is a cross-sectional view of a multi-junction solar cell of an embodiment.

The second embodiment relates to a multi-junction solar cell. FIG. 7 is a conceptual cross-sectional view of the multi-junction solar cell of the second embodiment. The multi-junction solar cell 200 in FIG. 7 includes the solar cell (first solar cell) 100 (101) of the first embodiment on the light incident side and a second solar cell 201. The bandgap of the light absorbing layer of the second solar cell 201 is smaller than the bandgap of the p-type light-absorbing layer 2 of the solar cell 100 of the first embodiment. Note that the multi-junction solar cell of the embodiment includes a solar cell in which three or more of solar cells are joined.

The bandgap of the p-type light-absorbing layer 2 of the first solar cell 101 of the second embodiment is approximately 2.0 eV to 2.2 eV. Therefore, the bandgap of the light absorbing layer of the second solar cell 201 is preferably 1.0 eV or more and 1.6 eV or less. The light absorbing layer of the second solar cell 201 is preferably one type selected from the group consisting of: one or more types of compound semiconductor layers selected from the group consisting of CIGS semiconductor layers and CdTe semiconductor layers containing In at a high ratio; microcrystalline silicon; and a perovskite-type compound.

Third Embodiment

Figure 8:
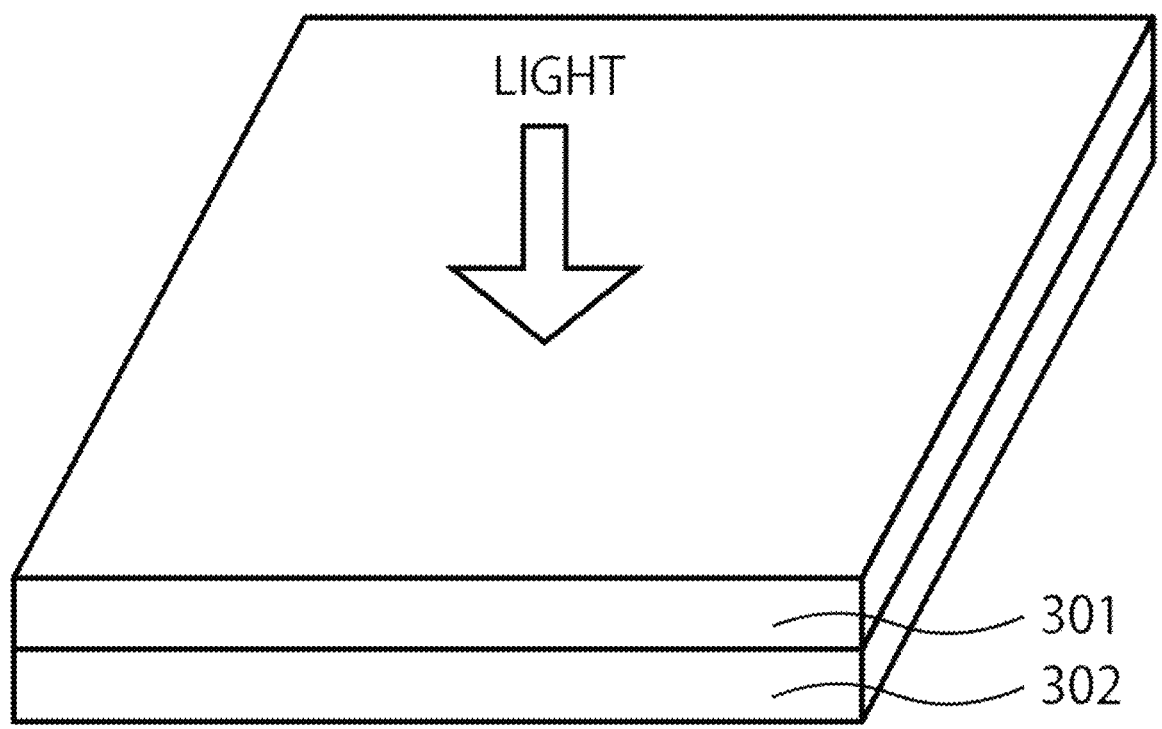
FIG. 8 is a perspective view of a solar cell module of an embodiment.

The third embodiment relates to a solar cell module. FIG. 8 is a perspective view of the solar cell module 300 of the third embodiment. The solar cell module 300 in FIG. 8 is a solar cell module in which a first solar cell module 301 and a second solar cell module 302 are laminated. The first solar cell module 301 is disposed on the light incident side and includes the solar cell 100 of the first embodiment. The second solar cell module 302 preferably includes the second solar cell 201.

Figure 9:
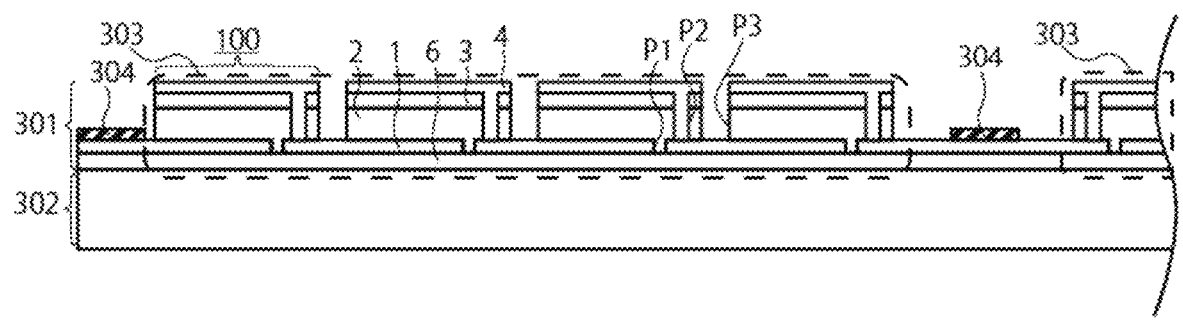
FIG. 9 is a cross-sectional view of a solar cell module of an embodiment.

FIG. 9 is a cross-sectional view of the solar cell module 300. FIG. 9 shows a detailed structure of the first solar cell module 301, but does not show the structure of the second solar cell module 302. In the second solar cell module 302, the structure of the solar cell module is appropriately selected according to, for example, the light absorbing layer of the solar cell to be used. The solar cell module in FIG. 9 includes a plurality of submodules 303 enclosed by the dotted line. In the submodule 303, a plurality of solar cells 100 (solar cell) are electrically connected side by side in series in the horizontal direction. The plurality of submodules 303 are electrically connected in series or in parallel. Adjacent submodules 303 are electrically connected by a busbar 304.

The solar cell 100 is scribed. In adjacent solar cells 100, the n-electrode 4 on the upper side and the p-electrode 1 on the lower side are connected. Similar to the solar cell 100 of the first embodiment, the solar cell 100 of the third embodiment includes the p-electrode 1, the p-type light-absorbing layer 2, the n-type layer 3, and the n-electrode 4. The solar cell 100 of the third embodiment further includes a substrate 6 disposed between the p-electrode 1 and the second solar cell module 302. A white glass plate is desirably used for the substrate 6. General glasses such as Quartz, soda-lime glass, and chemically strengthened glass, or resins such as polyimide, and acrylic resin can be used for the substrate 6. Both ends of the solar cell 100 in the submodule 303 are connected to the busbar 304. The busbar 304 is preferably configured to electrically connect a plurality of submodules 303 in parallel or in series and adjust the output voltage with the second solar cell module 302.

Fourth Embodiment

Figure 10:
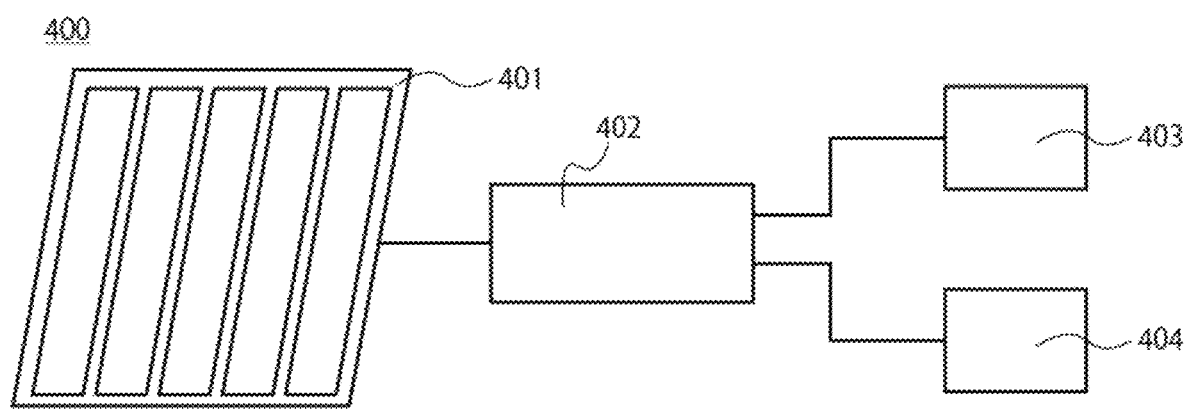
FIG. 10 is a structural view of a photovoltaic power generation system of an embodiment.

The fourth embodiment relates to a photovoltaic power generation system. The solar cell module of the third embodiment can be used as a generator configured to generate power in the photovoltaic power generation system of the fourth embodiment. The photovoltaic power generation system of the embodiment generates power by using a solar cell module. Specifically, the photovoltaic power generation system includes a solar cell module configured to generate power, a power conversion unit configured to perform power conversion on generated electricity, and an electric storage unit configured to store generated electricity or a load configured to consume generated electricity. FIG. 10 is a structural view of the photovoltaic power generation system 400 of the embodiment. The photovoltaic power generation system 400 in FIG. 10 includes a solar cell module 401 (300), a converter 402, a storage battery 403, and a load 404. Either the storage battery 403 or the load 404 may be omitted. The load 404 may be configured to be capable of utilizing electric energy stored in the storage battery 403. The converter 402 includes a device including, for example, a DC-DC converter, a DC-AC converter, and an AC-AC converter, which are a circuit or an element that performs power conversion such as transformation or DC-AC conversion. A preferred structure may be employed for the structure of the converter 402 according to generated voltage, the structure of the storage battery 403, or the structure of the load 404.

The solar cell included in the submodule 303 having received light and being included in the solar cell module 300, generates power. The electric energy is converted by the converter 402, and then stored in the storage battery 403 or consumed in the load 404. In the solar cell module 401, preferably, a sunlight tracking drive unit configured to cause the solar cell module 401 to be constantly directed toward the sun or a concentrator configured to concentrate sunlight is provided, or a device configured to enhance power generation efficiency or the like is added.

The photovoltaic power generation system 400 is preferably used for immovable properties such as residences, commercial facilities, and factories, or movable properties such as vehicles, aircrafts, and electronic devices. The photovoltaic power generation system 400 can also be utilized for, for example, production of hydrogen used for fuel cells, by performing water electrolysis using the obtained power. Increase in the amount of power generation is expected by employing the photoelectric conversion element of the embodiment, which excels in conversion efficiency, for a solar cell module.

Hereinafter, the present disclosure will be further described in detail with reference to Examples, but the present disclosure is not limited to the following Examples.

EXAMPLE 1

The solar cell of Example 1 is an example of a light transmissive solar cell. An ITO transparent conductive film as the laminate-type p-electrode on the back side was deposited on a glass substrate on a side in contact with the glass, and then an antimony-doped tin oxide (ATO) transparent conductive film was deposited on the ITO film. An $SiO_x$ thin film was formed with a film thickness of approximately 2 nm on the p-electrode at room temperature in an oxygen/argon gas atmosphere by the sputtering method. Then, a $Cu_2O$ light absorbing layer was formed by the sputtering method in an oxygen/argon gas atmosphere with heating at 500° C. Further, a ZnGeO oxide as the n-type layer was deposited by the chemical vapor deposition (CVD) method at room temperature, and then an AZO transparent conductive film as the n-electrode on the surface side was deposited.

Highly doping the light absorbing layer on a side in contact with the p-electrode with Si suppressed recombination on the surface of the p-electrode, thus improving short circuit current. In a case where light entered from the n-electrode side, short circuit current, fill factor (FF), and V were enhanced, and conversion efficiency was improved to 1.4 times compared to a case where the p+ type region was not formed, that is, a case where the $SiO_x$ thin film was not formed. In a case where light entered from the p-electrode side, short circuit current was enhanced, and conversion efficiency was improved to 1.7 times compared to a case where the p+ type region was not formed, that is, a case where the $SiO_x$ thin film was not formed.

EXAMPLE 2

The solar cell of Example 2 is an example of a light transmissive solar cell. An ITO transparent conductive film as the laminate-type p-electrode on the back side was deposited on a glass substrate on a side in contact with the glass, and then an antimony-doped tin oxide (ATO) transparent conductive film was deposited on the ITO film. An $SiO_xN_y$ thin film with a film thickness of approximately 2 nm was formed on the p-electrode at room temperature in an oxygen/argon gas atmosphere by the sputtering method. Then, a $Cu_2O$ light absorbing layer was formed by the sputtering method in an oxygen/argon gas atmosphere with heating at 500° C. Further, a ZnGeO oxide as the n-type layer was deposited by the chemical vapor deposition (CVD) method at room temperature, and then an AZO transparent conductive film as the n-electrode on the surface side was deposited.

Highly doping the light absorbing layer on a side in contact with the p-electrode with Si and N suppressed recombination on the surface of the p-electrode, thus improving short circuit current. In a case where light entered from the n-electrode side, short circuit current, FF, and V were enhanced, and conversion efficiency was improved to 1.4 times compared to a case where the p+ type region was not formed, that is, a case where the $SiO_xN_y$ thin film was not formed. In a case where light entered from the p-electrode side, short circuit current was enhanced, and conversion efficiency was improved to 1.7 times compared to a case where the p+ type region was not formed, that is, a case where the $SiO_xN_y$ thin film was not formed.

EXAMPLE 3

The solar cell of Example 3 is an example of a light transmissive solar cell. An ITO transparent conductive film as the laminate-type p-electrode on the back side was deposited on a glass substrate on a side in contact with the glass, and then an antimony-doped tin oxide (ATO) transparent conductive film was deposited on the ITO film. An SiGe$_x$O$_y$ thin film with a film thickness of approximately 2 nm was formed on the p-electrode at room temperature in an oxygen/argon gas atmosphere by the sputtering method. Then, a Cu$_2$O light absorbing layer was formed by the sputtering method in an oxygen/argon gas atmosphere with heating at 500° C. Further, a ZnGeO oxide as the n-type layer was deposited by the chemical vapor deposition (CVD) method at room temperature, and then an AZO transparent conductive film as the n-electrode on the surface side was deposited.

Highly doping the light absorbing layer on a side in contact with the p-electrode with Si and Ge suppressed recombination on the surface of the p-electrode, thus improving short circuit current. In a case where light entered from the n-electrode side, short circuit current, FF, and V were enhanced, and conversion efficiency was improved to 1.4 times compared to a case where the p+ type region was not formed, that is, a case where the SiGe$_x$O$_y$ thin film was not formed. In a case where light entered from the p-electrode side, short circuit current was enhanced, and conversion efficiency was improved to 1.7 times compared to a case where the p+ type region was not formed, that is, a case where the SiGe$_x$O$_y$ thin film was not formed.

EXAMPLE 4

The solar cell of Example 4 is an example of a light transmissive solar cell. An ITO transparent conductive film as the laminate-type p-electrode on the back side was deposited on a glass substrate on a side in contact with the glass, and then an antimony-doped tin oxide (ATO) transparent conductive film was deposited on the ITO film. An SiGe$_x$O$_y$N$_z$ thin film was formed on the p-electrode at room temperature in an oxygen/argon gas atmosphere by the sputtering method. Then, a Cu$_2$O light absorbing layer was formed by the sputtering method in an oxygen/argon gas atmosphere with heating at 500° C. Further, a ZnGeO oxide as the n-type layer was deposited by the chemical vapor deposition (CVD) method at room temperature, and then an AZO transparent conductive film as the n-electrode on the surface side was deposited. The compositional ratio of Ge/(Zn+Ge) is desirably in a range of 0.5 to 3, and more preferably 1 to 2.

Highly doping the light absorbing layer on a side in contact with the p-electrode with Si, Ge, and N suppressed recombination on the surface of the p-electrode, thus improving short circuit current. In a case where light entered from the n-electrode side, short circuit current, FF, and V were enhanced, and conversion efficiency was improved to 1.4 times compared to a case where the p+ type region was not formed, that is, a case where the SiGe$_x$O$_y$N$_z$ thin film was not formed. In a case where light entered from the p-electrode side, short circuit current was enhanced, and conversion efficiency was improved to 1.7 times compared to a case where the p+ type region was not formed, that is, a case where the SiGe$_x$O$_y$N$_z$ thin film was not formed.

EXAMPLE 5

The solar cell of Example 5 is an example of a light transmissive solar cell. An ITO transparent conductive film as the laminate-type p-electrode on the back side was deposited on a glass substrate on a side in contact with the glass, and then an antimony-doped tin oxide (ATO) transparent conductive film was deposited on the ITO film. As the passivation layer, an HfO$_x$ layer partially including contact holes is formed on the p-electrode. An example of a method of manufacturing the passivation layer is as follows. Photoresist is applied to the p-electrode, followed by patterning, thus leaving resist in contact hole portions. HfO$_x$ is sputtered to form an HfO$_x$ film on the entire surface. Then, resist is dissolved by a solvent to lift off the HfO$_x$ layer, thus forming an HfO$_x$ layer partially including contact holes.

An SiO$_x$N$_y$ thin film was formed on the p-electrode at room temperature in an oxygen/argon gas atmosphere by the sputtering method. Then, a Cu$_2$O light absorbing layer was formed by the sputtering method in an oxygen/argon gas atmosphere with heating at 500° C. Further, a ZnGeO oxide as the n-type layer was deposited by the chemical vapor deposition (CVD) method at room temperature, and then an AZO transparent conductive film as the n-electrode on the surface side was deposited. The compositional ratio of Ge/(Zn+Ge) is desirably in a range of 0.5 to 3, and more preferably 1 to 2.

The light absorbing layer on the side in contact with the p-electrode was highly doped with Si and N. Further, the contact area between the p-electrode and the p-type light absorbing layer was decreased by the passivation layer. This further suppresses recombination on the surface of the p-electrode and improves short circuit current. In a case where light entered from the n-electrode side, short circuit current, FF, and V were enhanced, and conversion efficiency was improved to 1.4 times compared to a case where the p+ type region was not formed, that is, a case where the SiO$_x$N$_y$ thin film was not formed. In a case where light entered from the p-electrode side, short circuit current was enhanced, and conversion efficiency was improved to 1.7 times compared to a case where the p+ type region was not formed, that is, a case where the SiO$_x$N$_y$ thin film was not formed.

REFERENCE EXAMPLE 1

The solar cell of Reference Example 1 is an example of a non-light transmissive solar cell, which is opaque for visible light. Ti as the laminate-type p-electrode on the back side was deposited on a glass substrate on a side in contact with the glass substrate as an adhesion layer. Then, Au was deposited on Ti. An SiO$_x$ thin film was formed on the p-electrode at room temperature in an oxygen/argon gas atmosphere by the sputtering method. Then, a Cu$_2$O light absorbing layer was formed by the sputtering method in an oxygen/argon gas atmosphere with heating at 500° C. Further, a ZnGeO oxide as the n-type layer was deposited by the chemical vapor deposition (CVD) method at room temperature, and then an AZO transparent conductive film as the n-electrode on the surface side was deposited. The compositional ratio of Ge/(Zn+Ge) is desirably in a range of 0.5 to 3, and more preferably 1 to 2.

Highly doping the light absorbing layer on a side in contact with the p-electrode with Si suppressed recombination on the surface of the p-electrode, thus improving short circuit current.

EXAMPLE 6

The solar cell of Example 6 is an example in which the solar cell of Example 1 is used for a top cell of a tandem solar cell. The structure of the top cell is the same as Example 1.

To configure the tandem solar cell, a single crystal Si having a conversion efficiency of 22% as a single body is used for the bottom cell. The top cell and the bottom cell were laminated and electrically connected in parallel. Note that, to match the output voltages of both cells, the number of cells m of the top cell and the number of cells n of the bottom cell is adjusted so as to satisfy the relationship m×output V (top cell)=n×V (bottom cell).

The result of the research on the solar cell characteristics shows that, in a case where pseudo sunlight of 1 sun was irradiated, efficiency was enhanced by approximately 10% in a top cell as a single body, and efficiency was also enhanced in a tandem solar cell, compared to a multi-junction solar cell produced by using a solar cell including no p+ type region.

Here, some elements are expressed only by element symbols thereof.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solar cell comprising:
   a p-electrode;
   a p-type light-absorbing layer directly in contact with the p-electrode;
   an n-type layer; and
   an n-electrode, wherein
   the n-type layer is disposed between the p-type light-absorbing layer and the n-electrode, and
   a region in the p-type light absorbing layer from an interface between the p-type light-absorbing layer and the p-electrode toward the n-type layer is a p+ type region including a p-type dopant with a depth of 30 nm to 70 nm,
   wherein the p-type light-absorbing layer is a semiconductor layer made of an oxide of metal containing Cu,
   a maximum concentration of the p-type dopant in the p+ type region is $5.0 \times 10^{19}$ atoms/cm$^3$ or more and $1.0 \times 10^{21}$ atoms/cm$^3$ or less,
   an average concentration of the p-type dopant in the p+ type region is $1.0 \times 10^{19}$ atoms/cm$^3$ or more and $1.0 \times 10^{20}$ atoms/cm$^3$ or less; and
   the p-type dopant includes Si.

2. The solar cell according to claim 1, wherein a minimum concentration of the p-type dopant in the p+ type region is $1.0 \times 10^{18}$ atoms/cm$^3$ or more and $5.0 \times 10^{18}$ atoms/cm$^3$ or less.

3. The solar cell according to claim 1, wherein a position at which a concentration of the p-type dopant is maximum exists on a side of the interface of the p+ type region, and
   a position at which a concentration of the p-type dopant is minimum exists on a side of the n-type layer of the p+type region.

4. The solar cell according to claim 1, wherein an average concentration of the p-type dopant in the p+ type region is 5 times or more and 100 times or less a minimum concentration of the p-type dopant in the p+ type region,
   a maximum concentration of the p-type dopant in the p+ type region is 5 times or more and 100 times or less an average concentration of the p-type dopant in the p+ type region, and
   a maximum concentration of the p-type dopant in the p+ type region is 25 times or more and 1000 times or less a minimum concentration of the p-type dopant in the p+ type region.

5. The solar cell according to claim 1, wherein an average concentration of the p-type dopant in the p+ type region is 10 times or more and 100 times or less a minimum concentration of the p-type dopant in the p+ type region,
   a maximum concentration of the p-type dopant in the p+ type region is 10 times or more and 100 times or less an average concentration of the p-type dopant in the p+ type region, and
   a maximum concentration of the p-type dopant in the p+ type region is 100 times or more and 1000 times or less a minimum concentration of the p-type dopant in the p+ type region.

6. The solar cell according to claim 1, wherein a thickness of the p-type light-absorbing layer is 1,000 nm or more and 10,000 nm or less.

7. The solar cell according to claim 1, wherein a mesh-like, dotted, or line-shaped insulating film is disposed between the p-electrode and the p-type light-absorbing layer.

8. The solar cell according to claim 7, wherein, in a direction from the p-electrode to the n-electrode, an area in which the insulating film and the p-type light-absorbing layer are in contact is 80% or more and 95% or less of a sum of the area in which the insulating film and the p-type light-absorbing layer are in contact, and an area in which the p-type light-absorbing layer and the p-electrode are in contact.

9. A multi-junction solar cell comprising:
   the solar cell according to claim 1; and
   a solar cell including a light absorbing layer having a bandgap smaller than a bandgap of the p-type light-absorbing layer of the solar cell according to claim 1.

10. The multi-junction solar cell according to claim 9, wherein the light absorbing layer of the solar cell having a bandgap smaller than a bandgap of the p-type light-absorbing layer of the solar cell is one type selected from the group consisting of a compound semiconductor layer, microcrystalline silicon, and a perovskite-type compound, the light absorbing layer.

11. A solar cell module comprising the solar cell according to claim 1.

12. A solar cell module comprising the multi-junction solar cell according to claim 9.

13. A photovoltaic power generation system performing photovoltaic power generation using the solar cell module according to claim 11.

14. The solar cell according to claim 1, the p-type light-absorbing layer of the solar cell is cuprous oxide or a complex oxide of cuprous oxide.

15. The solar cell according to claim 1, wherein the p-electrode is a transparent electrode,
    the p-electrode includes $SnO_2$, and
    an additive of $SnO_2$ is selected from the group consisting of Zn, Al, Ga, In, Ti, Cu, Sb, Nb, F, and Ta.

* * * * *